US008015537B1

(12) United States Patent
Sundararajan et al.

(10) Patent No.: US 8,015,537 B1
(45) Date of Patent: Sep. 6, 2011

(54) AUTOMATED RATE REALIZATION FOR CIRCUIT DESIGNS WITHIN HIGH LEVEL CIRCUIT IMPLEMENTATION TOOLS

(75) Inventors: Arvind Sundararajan, Sunnyvale, CA (US); Nabeel Shirazi, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 205 days.

(21) Appl. No.: 12/468,640

(22) Filed: May 19, 2009

(51) Int. Cl.
*G06F 17/50* (2006.01)

(52) U.S. Cl. ........ 716/134; 716/108; 716/113; 716/106; 716/100

(58) Field of Classification Search .......... 716/106, 716/111, 109, 100, 118, 126, 108, 113, 134
See application file for complete search history.

(56) References Cited

U.S. PATENT DOCUMENTS

| | | | |
|---|---|---|---|
| 6,219,628 B1 | 4/2001 | Kodosky et al. | |
| 6,292,925 B1 | 9/2001 | Dellinger et al. | |
| 6,678,645 B1 | 1/2004 | Rajsuman et al. | |
| 6,889,369 B1 * | 5/2005 | Clifton et al. | 716/113 |
| 6,947,883 B1 * | 9/2005 | Gupta | 703/23 |
| 6,968,514 B2 | 11/2005 | Cooke et al. | |
| 6,996,799 B1 | 2/2006 | Cismas et al. | |
| 7,185,301 B2 * | 2/2007 | Hao et al. | 716/114 |
| 7,256,633 B1 * | 8/2007 | Rafiq | 327/202 |
| 7,352,836 B1 * | 4/2008 | Mendenhall | 375/372 |
| 7,382,824 B1 | 6/2008 | Marmash et al. | |
| 7,480,609 B1 | 1/2009 | Cavanagh et al. | |
| 7,612,625 B2 * | 11/2009 | Gao et al. | 331/177 R |
| 2003/0210603 A1 | 11/2003 | Ong | |
| 2005/0198459 A1 * | 9/2005 | Bogin et al. | 711/167 |
| 2008/0065922 A1 * | 3/2008 | Dour et al. | 713/400 |
| 2008/0256511 A1 | 10/2008 | Lay et al. | |
| 2008/0320348 A1 * | 12/2008 | Ayres et al. | 714/726 |
| 2009/0108900 A1 | 4/2009 | Sotiriou et al. | |
| 2009/0150136 A1 | 6/2009 | Yang | |

OTHER PUBLICATIONS

U.S. Appl. No. 12/468,764, filed May 19, 2009, Sundararajan et al.
Altera Corp., *DSP Builder User Guide*, Dec. 2007, pp. 3-5 to 3-10 and 4-1 to 4-16 (23 pp.), available from Altera Corporation, Sunnyvale, California, USA.
Synplicity, Inc., *Synplify DSP User Guide*, Sep. 2007, pp. 3-2, 3-25 to 3-32, and 8-5 (11 pp.), Actel Edition, available from Synplicity, Inc., Sunnyvale, California, USA.
Xilinx, Inc., *System Generator for DSP User Guide*, Mar. 2008, pp. 23-30 (9 pp.), Ver. 10.1, available from Xilinx, Inc., San Jose, California, USA.
Chiang, Anna S., "Programming Enters Designer's Core," *Electronic Engineering Times*, Feb. 19, 2001, pp. 106 & 110, vol. 1154, UBM Electronics.

* cited by examiner

*Primary Examiner* — Jack Chiang
*Assistant Examiner* — Brian Ngo
(74) *Attorney, Agent, or Firm* — Kevin T. Cuenot; Lois D. Cartier

(57) ABSTRACT

A computer-implemented method of automatic rate realization for implementing a circuit design within a programmable integrated circuit can include comparing data rates of clock domains of the circuit design with frequencies of available clock sources of the circuit design and determining which clock domains have data rates that match frequencies of clock sources. For each clock domain that has a data rate matching a frequency of a clock source, loads of the clock domain can be clocked using a multiple synchronous clock technique with the matching clock source. For each clock domain having a data rate that does not match a frequency of a clock source, loads of the clock domain can be clocked using a clock enable technique. The circuit design specifying the clock circuitry for each clock domain can be output.

16 Claims, 3 Drawing Sheets

US 8,015,537 B1

AUTOMATED RATE REALIZATION FOR CIRCUIT DESIGNS WITHIN HIGH LEVEL CIRCUIT IMPLEMENTATION TOOLS

FIELD OF THE INVENTION

The embodiments disclosed herein relate to programmable integrated circuit devices (ICs). More particularly, the embodiments relate to automatically realizing multiple data rates within a circuit design to be implemented within a programmable IC.

BACKGROUND

Programmable integrated circuits (ICs) are a well-known type of integrated circuit that can be programmed to perform specified logic functions. The phrase "programmable IC" can refer to various types of programmable ICs, whether partially programmable or fully programmable. Examples of programmable ICs can include, but are not limited to, devices such as Field Programmable Gate Arrays (FPGAs), Complex Programmable Logic Devices (CPLDs), Programmable Logic Arrays (PLAs), Programmable Array Logic (PAL) devices, or the like. Typically within a programmable IC, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs can be programmed by applying a processing layer, such as a metal layer, that programmably interconnects the various elements on the device. These programmable ICs are known as mask programmable devices. programmable ICs can also be implemented in other ways, e.g., using fuse or antifuse technology. The phrase "programmable IC" can include, but is not limited to these devices and may further encompass devices that are only partially programmable. For example, one type of programmable IC includes a combination of hard-coded transistor logic and a programmable switch fabric that programmably interconnects the hard-coded transistor logic.

Due to the rich functionality offered by modern programmable ICs, it is increasingly common to implement and deploy circuit designs using these devices. For example, a modern programmable IC can be used to implement a digital signal processing design that supports a plurality of different data rates.

High level modeling systems (HLMSs) refer to a class of electronic design automation (EDA) tools that facilitate graphic design of circuits and systems. Typically, a circuit designer uses a drag-and-drop paradigm of the HLMS to bring circuit blocks into a graphic circuit design environment. The circuit blocks can be interconnected by graphically drawing wires between the blocks. Each circuit block can specify information such as the operating frequency of the circuit block as well as the data types of the various input ports and output ports of the circuit block.

A modern HLMS can perform a function called rate realization. Rate realization refers to the process by which the various circuit blocks of the circuit design are coupled to a system clock. Conventional systems are constrained to using a particular rate realization technique for the entire circuit design. For example, a conventional HLMS will typically use a multiple synchronous clock-based rate realization technique where each different data rate is realized using a single, different clock source. In other cases, the HLMS will use a clock enable-based rate realization technique where a single clock source is used cooperatively with a clock enable network to realize a plurality of different data rates of the circuit design.

SUMMARY

The embodiments disclosed herein relate to automatically realizing multiple data rates within a circuit design to be implemented within a programmable integrated circuit. One embodiment of the present invention can include a computer-implemented method of automatic rate realization for implementing a circuit design within a programmable IC. The method can include comparing data rates of clock domains of the circuit design with frequencies of available clock sources of the circuit design and determining which clock domains have data rates that match frequencies of clock sources. For each clock domain that has a data rate matching a frequency of a clock source, loads of the clock domain can be clocked using a multiple synchronous clock technique with the matching clock source. For each clock domain having a data rate that does not match a frequency of a clock source, loads of the clock domain can be clocked using a clock enable technique. The circuit design specifying clock circuitry for each clock domain can be output. The comparing, the determining, the clocking loads of the clock domain using a multiple synchronous clock technique, the clocking loads of the clock domain using a clock enable technique, and the outputting are performed by the computer.

Clocking loads of the clock domain using a clock enable technique can include, for each clock domain having a data rate that does not match a frequency of a clock source, selecting a clock source having a frequency that is an integer multiple of the data rate of the clock domain, inserting a clock enable circuit into the circuit design for the selected clock source and the clock domain, and coupling a clock input port of each load of the clock domain to the selected clock source and coupling a clock enable port of each load of the clock domain to an output of the clock enable circuit. The clock enable circuit can be set to enable loads every Nth clock cycle, where N is the integer multiple of the frequency of the selected clock source as compared to the data rate.

In another aspect, clocking loads of the clock domain using a clock enable technique can include, for each clock domain having a data rate that does not match a frequency of a clock source, selecting a clock source having a frequency that is a smallest integer multiple of the data rate of the clock domain, inserting a clock enable circuit into the circuit design for the selected clock source and the clock domain, and coupling a clock input port of each load of the clock domain to the selected clock source and coupling a clock enable port of each load of the clock domain to an output of the clock enable circuit. The method can include setting the clock enable circuit to enable loads every Nth clock cycle, where N is the integer multiple of the frequency of the selected clock source as compared to the data rate.

Clocking loads of the clock domain using a multiple synchronous clock technique can include, for each clock domain having a data rate that matches a clock source, clocking loads of the clock domain with the clock source and coupling a clock enable port of the loads of the clock domain to a voltage source of the circuit design.

The computer-implemented method also can include selecting a clock source that drives at least a minimum number of loads from at least a first clock domain and a second clock domain, selecting a second clock source that has a frequency that is an integer multiple of either a data rate of the first clock domain or a data rate of the second clock domain, and clocking at least a portion of the loads from the first clock domain or at least a portion of the loads from the second clock domain using the second clock source and the clock enable technique.

In another aspect, the computer-implemented method can include identifying a first clock source that clocks more than a predetermined number of loads, selecting a plurality of loads clocked by the first clock source, determining a second clock source that has a frequency that is an integer multiple of the data rate of the selected plurality of loads, and clocking the selected plurality of loads with the second clock source using the clock enable technique.

In a further aspect, the computer-implemented method can include selecting a clock circuit to generate at least one of the available clock sources of the circuit design according to a size of load formed by a clock domain driven by the at least one of the available clock sources.

Another embodiment of the present invention can include a computer-implemented method of automatic rate realization for implementing a circuit design within a programmable integrated circuit including comparing data rates of clock domains of the circuit design with frequencies of available clock sources of the circuit design, for each clock domain, selecting a rate realization technique according to the comparison, and coupling loads of each clock domain to clock sources according to the selected rate realization technique for each respective clock domain. The circuit design specifying clocking circuitry for each clock domain can be output. The comparing, the selecting, the coupling, and the outputting are performed by the computer.

Selecting a clocking technique according to the comparison can include, when the data rate of the clock domain matches a frequency of a clock source, coupling loads of the clock domain to the clock source using a multiple synchronous clock technique. When the data rate of the clock domain does not match a frequency of a clock source, loads of the clock domain can be coupled to a clock source having a frequency that is an integer multiple of the data rate of the clock domain.

Coupling loads of the clock domain to the clock source using a multiple synchronous clock technique can include clocking loads of the clock domain with the clock source and coupling a clock enable port of the loads of the clock domain to a voltage source. Coupling loads of the clock domain to a clock source that is an integer multiple of the data rate of the clock domain can include selecting the clock source having a frequency that is a smallest integer multiple of the data rate of the clock domain.

Coupling loads of the clock domain to a clock source that is an integer multiple of the data rate of the clock domain can include, for each clock domain, inserting a clock enable circuit into the circuit design for the selected clock source and the clock domain, coupling a clock input port of each load of the clock domain to the selected clock source and coupling a clock enable port of each load of the clock domain to an output of the clock enable circuit, and setting the clock enable circuit to enable loads every Nth clock cycle, where N is the integer multiple of the frequency of the selected clock source as compared to the data rate.

Yet another embodiment of the present invention can include a computer program product including a computer-usable medium having computer-usable program code that, when executed by a data processing system, causes the data processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to rate realization for circuit designs having multiple data rates. In accordance with the inventive arrangements disclosed within this specification, rate realization for a multi-rate circuit design can be performed where any one of a plurality of different rate realization techniques can be dynamically applied according to the data rate to be realized and the frequencies of the available clock sources. By automatically selecting and applying different rate realization techniques when processing a circuit design, benefits such as decreased power consumption and decreased implementation time may be achieved.

The embodiments described within this specification can be implemented in the form of computer-usable program code executing within a computer. For example, the various functions described can be performed by an electronic design automation (EDA) tool executing within a computer. A "computer" suitable for storing and/or executing program code will include at least one processor coupled directly or indirectly to memory elements through a system bus. The memory elements can include various physical memories such as local memory, or random access memory, employed during actual execution of the program code, bulk storage, and cache memories which provide temporary storage of at least some program code in order to reduce the number of times code must be retrieved from bulk storage during execution.

I/O devices, such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

Figure 1:
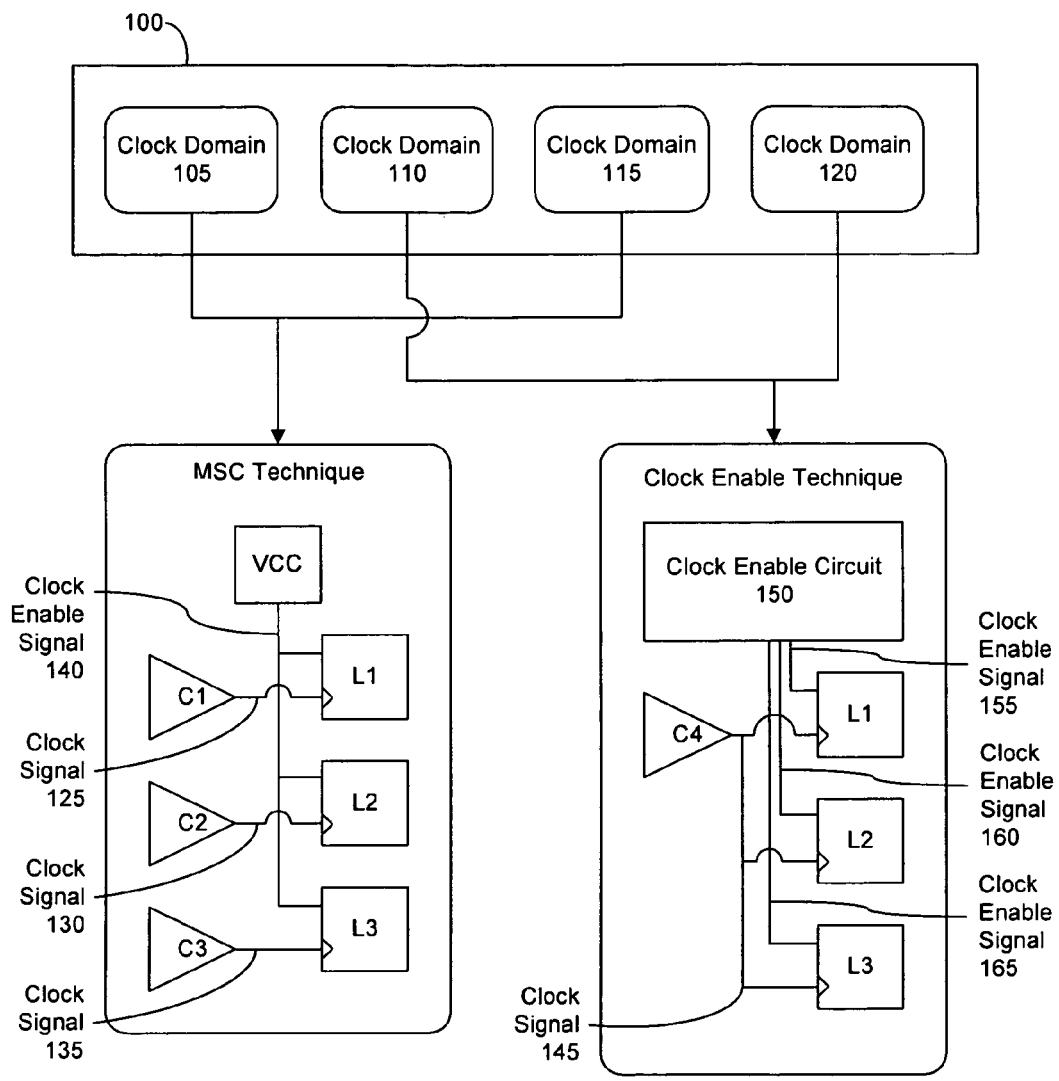
FIG. 1 is a pictorial illustration of a method of performing automatic rate realization for a circuit design to be implemented within a programmable integrated circuit (IC) in accordance with one embodiment of the present invention.

FIG. 1 is a pictorial illustration of a method of performing automatic rate realization for a circuit design to be implemented within a programmable integrated circuit (IC) in accordance with one embodiment of the present invention. FIG. 1 illustrates a multi-rate circuit design 100. Circuit design 100 can be a programmatic description of a circuit design, or a subsystem of a circuit design, that is to be implemented within a programmable IC using an EDA tool executing within a computer. As shown, circuit design 100 includes a plurality of clock domains 105, 110, 115, and 120. Each of clock domains 105-120 can operate at a specified and unique data rate.

As used herein, the phrase "data rate" can specify a particular frequency at which components are to operate, e.g., an operational frequency. The phrase "data rate" also can refer to a clock domain, which references the various components and/or loads that are driven at the specified data rate. Each component or load of the circuit design that is to be driven at a particular data rate can be said to be "of" that data rate or within the clock domain that corresponds to that data rate. Thus, each of clock domains 105, 110, 115, and 120 of circuit design 100 can specify a particular set of components and a data rate at which such components are to operate, e.g., an operational frequency.

FIG. 1 illustrates that different clock domains of a circuit design may be processed independently with different rate realization techniques being applied to different clock domains according to established criteria. In accordance with the embodiments disclosed within this specification, different rate realization techniques can be selectively applied to different clock domains, and thus, data rates, to implement different clock domains or portions of clock domains according to the availability of clock sources, the frequency of clock sources, and the data rates of the clock domains. Thus, rather than use one clock realization technique for implementing the entirety of a circuit design or subsystem, one rate realization technique can be applied to one clock domain, or a portion thereof, and another rate realization technique may be applied to another clock domain, or portion thereof.

As shown, clock domains 105 and 115 can be implemented using a first rate realization technique. The first rate realization technique can be a multiple synchronous clock-based rate realization technique referred to as "MSC" or the "MSC technique." The MSC technique refers to a process where a plurality of clock sources, each operating at a different frequency, are used. Each clock source drives a particular clock domain.

Data rates 110 and 120 can be implemented using a second rate realization technique that is based upon clock enabling networks, referred to as the "clock enable technique." The clock enable technique utilizes a single clock source to drive loads of different clock domains, and thus, different data rates. The operational frequency of the loads is controlled through clock enable networks that are added to circuit 100.

As shown, within the MSC technique, each of a plurality of clock sources C1, C2, and C3 drives a respective load L1, L2, and L3. Though the rate realization techniques described within this specification are illustrated with a single load, each of loads L1, L2, and L3 can represent a plurality of loads, e.g., all loads of a given clock domain operating at a particular data rate. Each clock source C1, C2, and C3 outputs a respective clock signal 125, 130, and 135. Each of clock signals 125-135 can be a different frequency. The clock enable signal 140 for each of loads L1, L2, and L3 is taken from the voltage source of circuit design 100 denoted as VCC. That is, the clock enable port of each of loads L1, L2, and L3 is coupled, or connected, to VCC. As such, each of loads will L1, L2, and L3 will switch, or operate, at the frequency of the particular clock signal driving that load at the clock port of the load. Load L1 will operate at the frequency of clock signal 125. Load L2 will operate at the frequency of clock signal 130. Load L3 will operate at the frequency of clock signal 135.

Accordingly, each load of a clock domain in an MSC configuration will be driven by a single, and same, clock source. The clock enable port of each such load will be coupled to the voltage source so that the operational frequency of each load, e.g., the data rate, will be the frequency of the clock signal driving each respective load. Within conventional applications of the MSC technique, once a clock source is mapped to a particular clock domain, or data rate, that clock source is not utilized to drive any other clock domain. This restriction maintains a one-to-one relationship between clock domain and clock source. Due to the one-to-one correspondence between clock domain and clock source, it can be seen that within a conventional application of the MSC technique, a subsystem that has a number of data rates that exceeds the number of available clock sources may not be feasible to implement within hardware.

By comparison, the clock enable technique utilizes a single clock source C4. Clock source C4 provides clock signal 145 to each of loads L1, L2, and L3. Within this example, again, each of loads L1, L2, and L3 can represent one or more loads, e.g., a particular clock domain. Each of loads L1, L2, and L3 can have a different data rate. As shown, each of loads L1, L2, and L3, despite having a different data rate, receives the same clock signal 145. Clock enable circuit 150, however, can generate different clock enable signals that implement the needed data rate for each of loads L1, L2, and L3. That is, the clock enable signals generated by clock enable circuit 150 allow each load to switch at a different interval as measured in cycles of clock signal 145, e.g., every "N" cycles of clock signal 145, where N is an integer value.

Thus, load L1 can receive clock enable signal 155 which causes load L1 to have an operational frequency that is the frequency of clock signal 145 divided by N. Load L2 can receive clock enable signal 160 which causes load L2 to have an operational frequency that is the frequency of clock signal 145 divided by M, which can be an integer value that is not equal to N. Finally, load L3 can receive a clock enable signal 165 that causes load L3 to have an operational frequency that is the frequency of clock signal 145 divided by X, where X can be an integer that is not equal to either M or N.

Within a conventional clock enable configuration, a clock source used in this manner is not used to directly clock any other clock domains. A disadvantage of the clock enable technique is increased power dissipation. Each load is driven by a clock signal having a frequency that is higher than the data rate of the load. The clock enable technique also can require increased time for performing map, place, and/or route. The clock enable networks, in reference to clock enable circuit 150 and the routing resources that distribute clock enable signals 155-165 to the loads of the various clock domains, typically are implemented in the programmable fabric of the programmable IC. This not only consumes resources, e.g., components and routing resources, that would otherwise be available for use by the user's circuit design, but also requires processing power to perform map, place, and route to implement the clock enable networks.

As known, circuit designs are implemented within a programmable IC by mapping constructs of the programmatic circuit description to hardware elements available on the programmable IC. The mapped constructs then can be placed by assigning each mapped construct to particular hardware elements, each having a defined location on the programmable IC. The various elements can be coupled together using the programmable interconnect fabric during the routing process.

The embodiments described herein can selectively apply the MSC technique or the clock enable technique to each clock domain of a circuit design on an individual clock domain basis. Further, in applying each rate realization technique, clock sources may be reused. This allows a clock source to drive one clock domain using the MSC technique and also drive a different clock domain using the clock enable technique.

Figure 2:
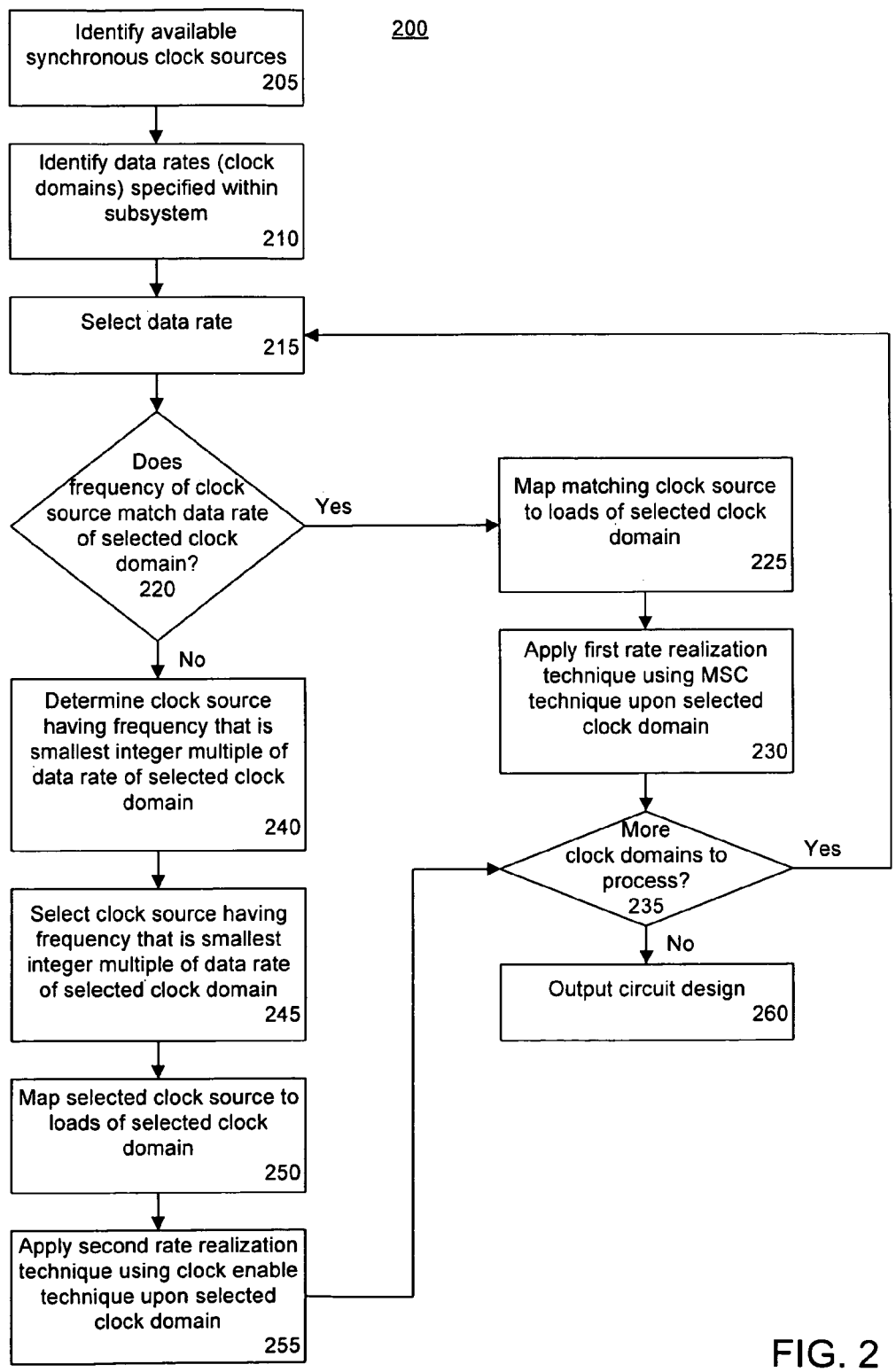
FIG. 2 is a flow chart illustrating a method of performing automatic rate realization for a circuit design to be implemented within a programmable IC in accordance with another embodiment of the present invention.

FIG. 2 is a flow chart illustrating a method 200 of performing automatic rate realization for a circuit design to be implemented within a programmable IC in accordance with another embodiment of the present invention. Method 200 can be performed by an EDA tool executing within a computer as described. The various steps described with reference to FIG. 2, as well as the other figures of this specification, can be performed automatically by the EDA tool. Method 200 can begin in a state where a user is developing a circuit design within an EDA tool. The circuit design being developed may be a portion of a larger circuit design, e.g., a subsystem of a larger system design. It should be appreciated that while the embodiments disclosed within this specification are described with reference to a subsystem, the techniques may be applied to a circuit design that is to be implemented independently as a standalone system or circuit design within the programmable IC.

In step 205, the system can identify available synchronous clock sources (clock sources). The set of available clock sources will be referred to within this specification as the "clock pool." The system can determine the clock pool through an evaluation of the architecture of the programmable IC within which the circuit design and subsystem are to be implemented and an evaluation of the circuit design within which the subsystem is to be incorporated. After step 205, the number of clock sources of the clock pool and the frequency of each clock source will be known to the system.

For example, when creating a subsystem within an HLMS, or other EDA tool, typically the clock sources available for use by the subsystem are known as the larger circuit design has been defined with at least a minimal degree of specificity where clock frequencies have been ascertained or defined. Similarly, as the architecture of the programmable IC within which the circuit design is to be implemented also is known, the various clock circuits available within that device for generating clock signals are known. A clock generating circuit, whether a delay-locked-loop, a digital clock manager, a phase-locked-loop, or the like, will often be capable of generating a plurality of different clock signals, each having a different frequency. For purposes of this specification, each clock signal generated by such a clock circuit can be referred to as a "clock source," which is to be distinguished from the clock circuit itself. Thus, if a digital clock manager of a field programmable gate array (FPGA) type of programmable IC is capable of generating four different clock signals, that digital clock manager effectively contributes four clock sources to the clock pool.

Generally, a programmable IC will include dedicated clock circuitry. That is, a programmable IC will have dedicated clock signal generating circuits and dedicated wires, e.g., routing resources, that may only be used to distribute clock signals throughout the programmable IC. In this regard, the term "clock source" is intended to refer to the clock signals that may be generated and distributed using this dedicated clock circuitry, exclusive of any other programmable circuitry of the programmable IC that is not dedicated to clock generation or distribution. For example, a clock source will not refer to any sort of clock circuitry that is formed from the programmable fabric of the programmable IC that may be used to implement a user-specified circuit.

In step 210, the system can identify the data rates specified within the subsystem. The subsystem to be incorporated into the circuit design will include a plurality of different data rates and, therefore, may be referred to as a multi-rate circuit design. As noted, each data rate defines a clock domain. Beginning in step 220, the system can begin to process the various clock domains of the subsystem and select a rate realization technique to use in implementing, or clocking, each clock domain. In step 215, a clock domain, and thus, a data rate, can be selected from those identified from the subsystem in step 210.

In step 220, the system can determine whether a frequency of a clock source from the clock pool matches the data rate of the selected clock domain. In general, the system can selectively apply different rate realization techniques to implement different clock domains or portions of clock domains according to the availability of clock sources and the data rate to be implemented. The rate realization technique selected for application to a particular clock domain can be selected according to whether the data rate of the selected clock domain of the subsystem matches the frequency of any clock sources from the clock pool. When the frequency of a clock source does match the data rate of the selected clock domain, the method can proceed to step 225. When no clock source within the clock pool has a frequency that matches the data rate of the selected clock domain, the method can continue to step 240.

Continuing with step 225, where the frequency of a clock source matches the data rate of the selected clock domain, the loads, e.g., components, of the selected clock domain can be mapped to the matching clock source. The mapping can indicate that each such load, e.g., each component of the selected clock domain, will be driven by the matching clock source.

In step 230, a first rate realization technique can be applied by implementing the MSC technique upon the selected clock domain. Accordingly, the system can modify the circuit design to specify, or indicate, that the clock port of each load within the selected clock domain can be coupled to the matching clock source to receive the clock signal generated by the matching clock source. The clock enable port of each such load can be coupled to the power supply of the circuit design. Accordingly, each load within the selected clock domain will have an operational frequency, e.g., a data rate, equal to the frequency of the matching clock source.

Whereas conventional approaches that utilize the MSC technique do not re-use a clock source once mapped to a clock domain, in accordance with the embodiments disclosed herein, mapping of a clock source to a particular clock domain or data rate does not remove that clock source from the clock pool. The clock source matching the data rate of the selected clock domain will remain within the clock pool. As such, that clock source will be available for re-use as will be described in greater detail within this specification.

After step 230, the method can proceed to step 235. In step 235, the system can determine whether more clock domains of the subsystem remain to be processed. If so, the method can loop back to step 215 to select a next clock domain to be processed. If no further clock domains remain to be processed, the method can continue to step 260, wherein the resulting circuit design, inclusive of any clock configuration data specifying clock circuitry or clock implementation details for the clock domains, can be output. As used herein, "outputting" and/or "output" can mean, for example, writing to a file, writing to physical memory of a computer system, writing to a user display or other output device, playing audible notifications, sending or transmitting to another system, exporting, or the like.

Continuing with step 240, where no clock sources are found to have a frequency matching the data rate of the selected clock domain, a clock source to which the selected clock domain can be mapped can be selected using an alternate methodology. In step 240, a clock source can be selected that has a frequency that is an integer multiple of the data rate of the selected clock domain. In one embodiment, the clock source that has a frequency that is a smallest integer multiple of the data rate of the selected clock domain can be selected. For example, consider the case where the data rate of the selected clock domain is 5 MHz and the clock pool includes a clock source having a frequency of 10 MHz and clock source having a frequency of 15 MHz. The clock source having a frequency of 10 MHz is two times the data rate of the selected clock domain while the clock source having a frequency of 15 MHz is three times the data rate of the selected clock domain. The clock source having a frequency of 10 MHz can be selected as being the smallest integer multiple, e.g., two, of the data rate.

In step 245, the system can select the clock source determined in step 240 having a frequency that is the smallest integer multiple of the data rate of the selected clock domain. In step 250, the system can map the selected clock source to loads of the selected clock domain. As noted, because clock sources are not removed from the clock pool when mapped to a clock domain, it is possible that the clock source selected in step 245 will have been mapped to another clock domain, e.g., in step 225 or within step 250 during a prior iteration of the method described.

In step 255, a second rate realization technique can be applied by using the clock enable technique upon the selected clock domain. As noted, the clock enable technique refers to the process of using a clock enable network where each clock enable network realizes a particular data rate. A single clock source is used in conjunction with the clock enable network. Accordingly, the circuit design can be modified so that the clock port of each load of the selected clock domain is coupled to the clock signal generated by the selected clock source. The circuit design further can be modified through the inclusion of a clock enable circuit that outputs a clock enable signal to the clock enable port of each load within the selected data rate.

The clock enable circuit ensures that each load driven by the selected clock source is clocked every "N" cycles of the frequency of the selected clock source, where N is the result of dividing the frequency of the selected clock source by the data rate of the selected clock domain. In this case, the value of N will be equal to the smallest integer multiple previously described. Recalling the prior example, if the data rate is 5 MHz and the clock source has a frequency of 10 MHz, the value of N will be two. The clock enable circuit will cause each load to be enabled, and thus operational, on every other clock cycle output from the selected clock source. This results in each load of the selected clock domain being driven by a clock source having a frequency of F, but having an operational frequency that is F/N, which is equivalent to the desired data rate for the selected clock domain.

It should be appreciated that when a clock source is used within a clock enable configuration and subsequently used to drive another clock domain also using a clock enable configuration, a single block denoted as the clock enable circuit can be used. In such cases, the mapping of a clock source to further clock domains using the clock enable technique can result in the expansion of the clock enable circuitry to output further clock enable circuits. Still, the clock enable circuit may be implemented as a single larger circuit that can output the needed number of clock enable signals or as a plurality of smaller clock enable circuits. Accordingly, when a clock enable circuit is included in the circuit design, such action may refer to including an actual additional circuit block or to expanding the capacity, in terms of the number of clock enable signals generated, by an existing clock enable circuit and adding the necessary routing.

As noted with regard to the MSC technique, the particular clock source that is selected or determined in step 240 may have already been mapped to loads of one or more other clock domains. If so, the clock source still may be mapped to the loads of the selected clock domain. For example, it is possible to have a same clock source drive loads of a first clock domain through the MSC technique and have that same clock source drive loads of a second clock domain using the clock enable technique. The clock source will have a frequency that exactly matches the data rate of the first clock domain. The frequency of the clock source will be the smallest integer multiple of the data rate of the second clock domain.

After step 255, the method can continue to step 235, where the system can determine whether any further clock domains of the subsystem remain to be processed. If so, the method can loop back to step 215 to continue processing. If not, the method can proceed to step 260 to output the resulting circuit design.

Figure 3:
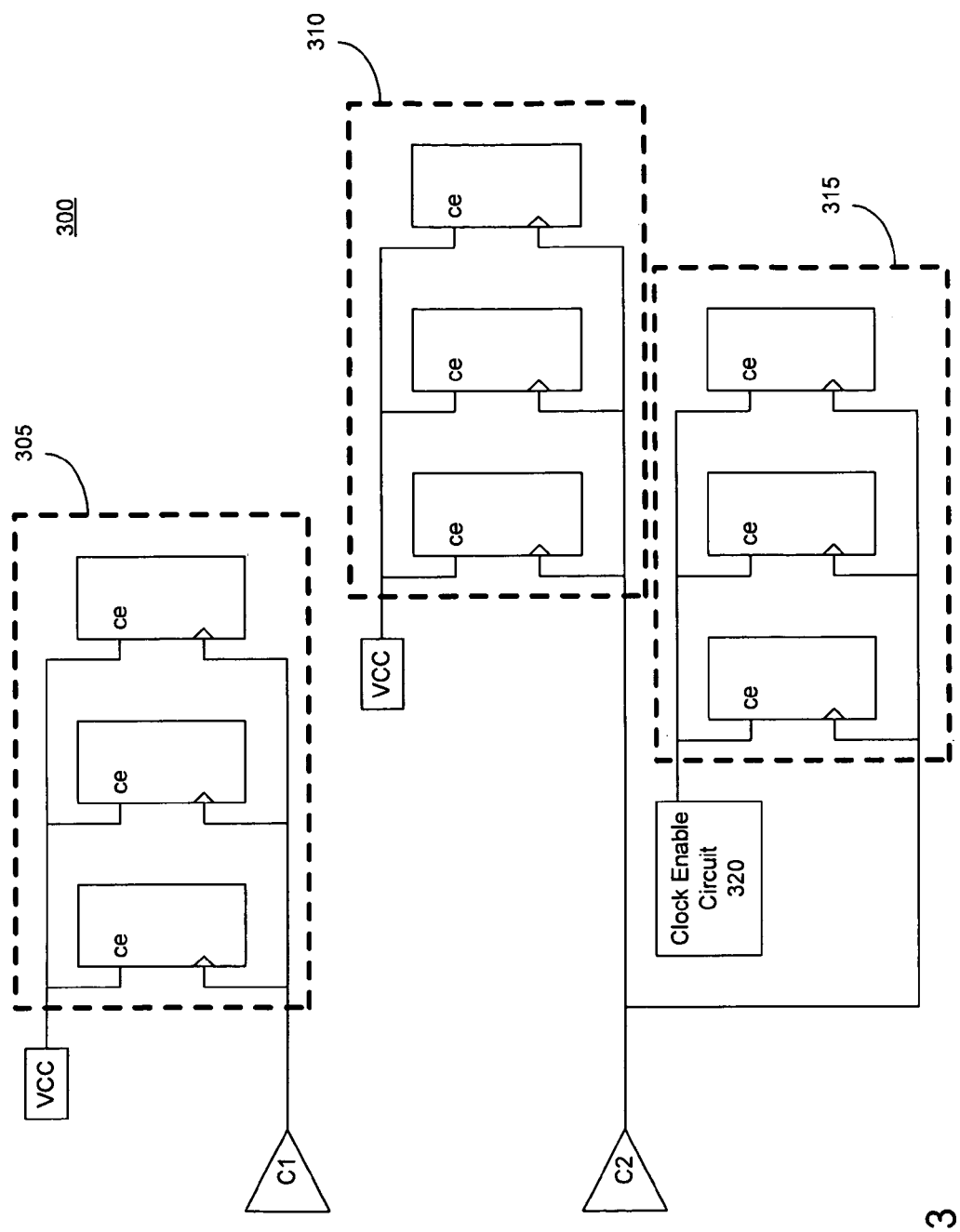
FIG. 3 is a schematic diagram illustrating a subsystem of a circuit design implemented in accordance with the embodiments described within this specification.

FIG. 3 is a schematic diagram illustrating a subsystem 300 of a circuit design implemented in accordance with the embodiments described within this specification. As shown, subsystem 300 includes two clock sources C1 and C2. As shown, clock source C1 drives clock domain 305. Clock domain 305 can include a plurality of clocked loads of a particular data rate. Clock source C1 is coupled to clock domain 305 using the MSC technique where the clock enable port of each load is coupled to the power supply or VCC, thereby ensuring that each load of clock domain 305 has an operational frequency, e.g., a data rate, equal to the frequency of clock source C1. In this example, it can be presumed that the data rate of clock domain 305 exactly matched the frequency of clock source C1.

By comparison, clock source C2 is coupled to clock domain 310, which operates at a data rate that is different from that of clock domain 305. Clock source C2 can be coupled to clock domain 310 using the MSC technique. Clock source C2 is also coupled to clock domain 315, which operates at a data rate that is different from that of either clock domain 305 or clock domain 310. Clock source C2 can be coupled to clock domain 315 using the clock enable technique. With regard to clock domain 310, the clock enable port of each load is coupled to the power supply. As such, the data rate of each component is equivalent to the frequency of clock source C2. In this case, as noted with respect to clock source C1, the frequency of clock source C2 can be assumed to exactly match the data rate of clock domain 310.

With regard to clock domain 315, clock source C2 is coupled to each load of clock domain 315 using the clock enable technique. As shown, the clock enable port of each load of clock domain 315 is coupled to a clock enable circuit 320. It can be assumed that the frequency of clock source C2 did not match the data rate of clock domain 315, but was the smallest integer multiple of the data rate of clock domain 315. Accordingly, presuming a relationship where N=F/DR, where the frequency of clock source C2 is denoted as F and the data rate of clock domain 315 is denoted as DR, the clock enable circuit 320 causes each of load of clock domain 315 to have a data rate of F/N, or DR. That is, each of load of clock domain 315 will be clock enabled every Nth cycle of the clock signal generated by clock source C2.

FIG. 3 illustrates the case where a single clock source is used to drive one clock domain using the MSC technique and a different clock domain having a different data rate using the clock enable technique. It should be appreciated that more complex examples may be provided where the clock enable circuit 320 outputs multiple clock enable signals allowing clock source C2 to drive clock domain 310 and a plurality of different clock domains, each operating at a different data rate and using the clock enable technique.

In another embodiment, load balancing or other restrictions on the use of clock sources can be incorporated into the methodology described. For example, in some cases, loads that are already assigned to a particular clock source can be re-assigned to a different clock source. In illustration, a clock source that drives at least a minimum number of loads from a first clock domain and a second clock domain can be selected. A second clock source that has a frequency that is an integer multiple, e.g., a smallest integer multiple, of either the first clock domain or the second clock domain can be selected. That clock source can be determined to drive a number of loads that does not exceed a predetermined threshold number of loads. At least a portion of the loads from the first clock domain and/or the second clock domain can be clocking or mapped, e.g., re-clocked or re-mapped as the case may be, using the second clock source and a clock enable clocking technique.

In another example, a first clock source that clocks more than a predetermined number of loads can be selected. A plurality of loads clocked by the first clock source can be selected. A second clock source that has a frequency that is an integer multiple, e.g., a smallest integer multiple, of the operating frequency of the selected plurality of loads can be selected. If desired, the second clock source can be one that drives a number of loads that does not exceed a predetermined threshold number of loads. The selected plurality of loads can be clocked with the second clock source using the clock enable clocking technique.

In still another embodiment, the system can systematically or preferentially synthesize the clock pool. That is, while the data rates that are available for a given circuit design may be known, the particular hardware, e.g., clock circuits, used to generate each respective data rate (clock source) is not. The system can choose which clocks, such as a delay-locked-loop, a digital clock manager, a phase-locked-loop, are used to generate each data rate of the circuit design. Consider the case where a first clock domain forms a load that is much larger than the load formed by a second, or any other, clock domain of the circuit design. In that case, the system can choose which clock circuit to generate the data rate for the first clock domain. The system can select a clock circuit that does not rely upon a clock enable signal to produce the data rate needed for the first clock domain. This means that the circuit design will dissipate less power than had the clock source for the first clock domain been generated by a clock circuit operating at operational frequency than the first clock domain, but that utilizes clock enabling to achieve the lower data rate of the first clock domain.

By using both MSC-based and clock-enable-based rate realization techniques cooperatively as described, the amount of power dissipated by a circuit design can be reduced. It should be appreciated that using the clock source having a frequency with the smallest integer multiple of the data rate when no clock source provides a frequency that exactly matches the data rate reduces the amount of power consumed as compared to selecting a clock source that is an integer multiple of the data rate, but not the smallest integer multiple. Further, using both techniques in a cooperative manner allows more data rates to be used within a circuit design than in the case of using the MSC technique alone.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A computer-implemented method of automatic rate realization for implementing a circuit design within a programmable integrated circuit, the method comprising:
   comparing data rates of clock domains of the circuit design with frequencies of available clock sources of the circuit design;
   determining which clock domains have data rates that match frequencies of clock sources;
   for each clock domain that has a data rate matching a frequency of a clock source, clocking loads of the clock domain using a multiple synchronous clock technique with the matching clock source;
   for each clock domain having a data rate that does not match a frequency of a clock source, clocking loads of the clock domain using a clock enable technique; and
   outputting the circuit design specifying clock circuitry for each clock domain;
   wherein clocking loads of the clock domain using a multiple synchronous clock technique comprises, for each clock domain having a data rate that matches a clock source:
      clocking loads of the clock domain with the clock source; and
      coupling a clock enable port of the loads of the clock domain to a voltage source of the circuit design;
   wherein the comparing, the determining, the clocking loads of the clock domain using a multiple synchronous clock technique, the clocking loads of the clock domain using a clock enable technique, and the outputting are performed by the computer.

2. The computer-implemented method of claim 1, wherein clocking loads of the clock domain using a clock enable technique comprises, for each clock domain having a data rate that does not match a frequency of a clock source:
   selecting a clock source having a frequency that is an integer multiple of the data rate of the clock domain;
   inserting a clock enable circuit into the circuit design for the selected clock source and the clock domain; and
   coupling a clock input port of each load of the clock domain to the selected clock source and coupling a clock enable port of each load of the clock domain to an output of the clock enable circuit.

3. The computer-implemented method of claim 2, further comprising setting the clock enable circuit to enable loads every Nth clock cycle, where N is the integer multiple of the frequency of the selected clock source as compared to the data rate.

4. The computer-implemented method of claim 1, wherein clocking loads of the clock domain using a clock enable technique comprises, for each clock domain having a data rate that does not match a frequency of a clock source:
   selecting a clock source having a frequency that is a smallest integer multiple of the data rate of the clock domain;
   inserting a clock enable circuit into the circuit design for the selected clock source and the clock domain; and
   coupling a clock input port of each load of the clock domain to the selected clock source and coupling a clock enable port of each load of the clock domain to an output of the clock enable circuit.

5. The computer-implemented method of claim 4, further comprising setting the clock enable circuit to enable loads every Nth clock cycle, where N is the integer multiple of the frequency of the selected clock source as compared to the data rate.

6. The computer-implemented method of claim 1, further comprising:
   selecting a clock source that drives at least a minimum number of loads from at least a first clock domain and a second clock domain;
   selecting a second clock source that has a frequency that is an integer multiple of either a data rate of the first clock domain or a data rate of the second clock domain; and
   clocking at least a portion of the loads from the first clock domain or at least a portion of the loads from the second clock domain using the second clock source and the clock enable technique.

7. The computer-implemented method of claim 1, further comprising:
   identifying a first clock source that clocks more than a predetermined number of loads;
   selecting a plurality of loads clocked by the first clock source;
   determining a second clock source that has a frequency that is an integer multiple of the data rate of the selected plurality of loads; and
   clocking the selected plurality of loads with the second clock source using the clock enable technique.

8. The computer-implemented method of claim 1, further comprising selecting a clock circuit to generate at least one of the available clock sources of the circuit design according to a size of load formed by a clock domain driven by the at least one of the available clock sources.

9. A computer-implemented method of automatic rate realization for implementing a circuit design within a programmable integrated circuit, the method comprising:
   comparing data rates of clock domains of the circuit design with frequencies of available clock sources of the circuit design;
   for each clock domain, selecting a rate realization technique according to the comparison;
   coupling loads of each clock domain to clock sources according to the selected rate realization technique for each respective clock domain; and
   outputting the circuit design specifying clocking circuitry for each clock domain;
   wherein selecting a rate realization technique according to the comparison comprises, for each clock domain:
      when the data rate of the clock domain matches a frequency of a clock source, coupling loads of the clock domain to the clock source using a multiple synchronous clock technique; and
      when the data rate of the clock domain does not match a frequency of a clock source, coupling loads of the clock domain to a clock source having a frequency that is an integer multiple of the data rate of the clock domain;
   wherein coupling loads of the clock domain to the clock source using a multiple synchronous clock technique comprises:
      clocking loads of the clock domain with the clock source; and coupling a clock enable port of the loads of the clock domain to a voltage source;
wherein the comparing, the selecting, the coupling, and the outputting are performed by the computer.

10. The computer-implemented method of claim 9, wherein coupling loads of the clock domain to a clock source having a frequency that is an integer multiple of the data rate of the clock domain comprises, for each clock domain:
    inserting a clock enable circuit into the circuit design for the selected clock source and the clock domain;
    coupling a clock input port of each load of the clock domain to the selected clock source and coupling a clock enable port of each load of the clock domain to an output of the clock enable circuit; and
    setting the clock enable circuit to enable loads every Nth clock cycle, where N is the integer multiple of the frequency of the selected clock source of the data rate.

11. A computer program product, comprising:
    a non-transitory computer-usable medium comprising computer-usable program code that performs automatic rate realization for implementing a circuit design within a programmable integrated circuit, the computer-usable medium comprising:
    computer-usable program code that compares data rates of clock domains of the circuit design with frequencies of available clock sources of the circuit design;
    computer-usable program code that determines which clock domains have data rates that match frequencies of clock sources;
    computer-usable program code that, for each clock domain that has a data rate matching a frequency of a clock source, clocks loads of the clock domain using a multiple synchronous clock technique with the matching clock source;
    computer-usable program code that, for each clock domain having a data rate that does not match a frequency of a clock source, clocks loads of the clock domain using a clock enable technique; and
    computer-usable program code that outputs the circuit design specifying clock circuitry for each clock domain; and
    wherein the computer-usable program code that clocks loads of the clock domain using a multiple synchronous clock technique comprises computer-usable program code that, for each clock domain having a data rate that matches a clock source:
    clocks loads of the clock domain with the clock source; and
    couples a clock enable port of the loads of the clock domain to a voltage source of the circuit design.

12. The computer program product of claim 11, wherein the computer-usable program code that clocks loads of the clock domain using a clock enable technique comprises computer-usable program code that, for each clock domain having a data rate that does not match a frequency of a clock source:
    selects a clock source having a frequency that is an integer multiple of the data rate of the clock domain;
    inserts a clock enable circuit into the circuit design for the selected clock source and the clock domain; and
    couples a clock input port of each load of the clock domain to the selected clock source and couples a clock enable port of each load of the clock domain to an output of the clock enable circuit.

13. The computer program product of claim 11, wherein the computer-usable program code that clocks loads of the clock domain using a clock enable technique comprises computer-usable program code that, for each clock domain having a data rate that does not match a frequency of a clock source:
    selects a clock source having a frequency that is a smallest integer multiple of the data rate of the clock domain;
    inserts a clock enable circuit into the circuit design for the selected clock source and the clock domain; and
    couples a clock input port of each load of the clock domain to the selected clock source and couples a clock enable port of each load of the clock domain to an output of the clock enable circuit.

14. The computer program product of claim 13, wherein the non-transitory computer-usable medium further comprises computer-usable program code that sets the clock enable circuit to enable loads every Nth clock cycle, where N is the integer multiple of the frequency of the selected clock source as compared to the data rate.

15. The computer program product of claim 11, wherein the non-transitory computer-usable medium further comprises:
    computer-usable program code that selects a clock source that drives at least a minimum number of loads from at least a first clock domain and a second clock domain;
    computer-usable program code that selects a second clock source that has a frequency that is an integer multiple of either a data rate of the first clock domain or a data rate of the second clock domain; and
    computer-usable program code that re-clocks at least a portion of the loads from the first clock domain or at least a portion of the loads from the second clock domain using the second clock source and the clock enable technique.

16. The computer program product of claim 11, wherein the non-transitory computer-usable medium further comprises:
    computer-usable program code that identifies a first clock source that clocks more than a predetermined number of loads;
    computer-usable program code that selects a plurality of loads clocked by the first clock source and determines a second clock source that has a frequency that is an integer multiple of the data rate of the selected plurality of loads; and
    computer-usable program code that clocks the selected plurality of loads with the second clock source using the clock enable technique.

* * * * *